United States Patent [19]

Ramsdale et al.

[11] Patent Number: 4,706,203
[45] Date of Patent: Nov. 10, 1987

[54] CAPACITIVE GAUGING METHOD AND APPARATUS

[75] Inventors: Kurt A. Ramsdale; Keith E. Coffman, both of Shelburne, Vt.

[73] Assignee: Simmonds Precision Products, Inc., Tarrytown, N.Y.

[21] Appl. No.: 682,331

[22] Filed: Dec. 17, 1984

[51] Int. Cl.⁴ ................... G06G 7/57; G01F 23/00
[52] U.S. Cl. ................... 364/509; 73/304 R; 73/304 C
[58] Field of Search ........... 364/509; 73/304 B, 304 C

[56] References Cited

U.S. PATENT DOCUMENTS

| | | | |
|---|---|---|---|
| 3,119,267 | 1/1964 | Bartky | 73/304 C |
| 3,533,286 | 10/1970 | Westcott et al. | 73/304 C |
| 3,747,407 | 7/1973 | Wallman | 73/304 C |
| 3,864,974 | 2/1975 | Rauchwerger | 73/304 C |
| 3,916,689 | 11/1975 | Donnelly | 73/304 C |
| 4,086,528 | 4/1978 | Walton | 73/304 C |
| 4,130,796 | 12/1978 | Shum | 324/61 R |
| 4,149,231 | 4/1979 | Bukosky et al. | 73/304 C |
| 4,244,385 | 1/1981 | Hotine | 364/509 |
| 4,259,865 | 4/1981 | Myers | 73/304 C |
| 4,279,865 | 9/1981 | Wallman | 73/304 C |
| 4,337,638 | 7/1982 | Leonard et al. | 73/304 C |
| 4,350,039 | 9/1982 | Van Dyke et al. | 73/304 C |
| 4,441,157 | 4/1984 | Perchman et al. | 364/509 |
| 4,530,372 | 7/1985 | Overton et al. | 73/304 C |
| 4,559,507 | 12/1985 | Ramsdale et al. | 73/304 C |

Primary Examiner—Errol A. Krass
Assistant Examiner—Danielle B. Laibowitz
Attorney, Agent, or Firm—Cushman, Darby & Cushman

[57] ABSTRACT

Method and apparatus for deriving a correction factor used in calculating corrected liquid (e.g., fuel) quantity of a tank having a probe capacitance which varies in accordance with the quantity of liquid contained within the tank. The correction factor reduces sensing diode voltage drop errors and stray capacitance errors (affecting the capacitance of the probe) through use of a switchable high/low amplitude Lo-Z oscillator. All oscillator outputs are "low" amplitude relative to the output amplitudes of conventional devices. Signal processing is effected by inputting raw data (both reference and probe-sensed signals) to an analog-to-digital sampling circuit, which raw data are used for deriving the correction factor. The correction factor is then applied to the raw data to determine a corrected liquid quantity indication. Recalibration of the correction factor periodically permits automatic adaption to changing error magnitudes (i.e., changes in the deleterious effects of diode-voltage drop and/or stray capacitance). Additionally, the relative "health" of the component elements of the tank unit is monitored by tracking changes occurring during recalibration of the correction factor. Establishment of a correction factor outside a predetermined range might indicate faulty probe components or other such difficulties. Numerous practical advantages and economies are obtained by the method and apparatus presently disclosed because of the enabled use of an oscillator with a relatively low voltage output (e.g., under 10 volts peak).

16 Claims, 5 Drawing Figures

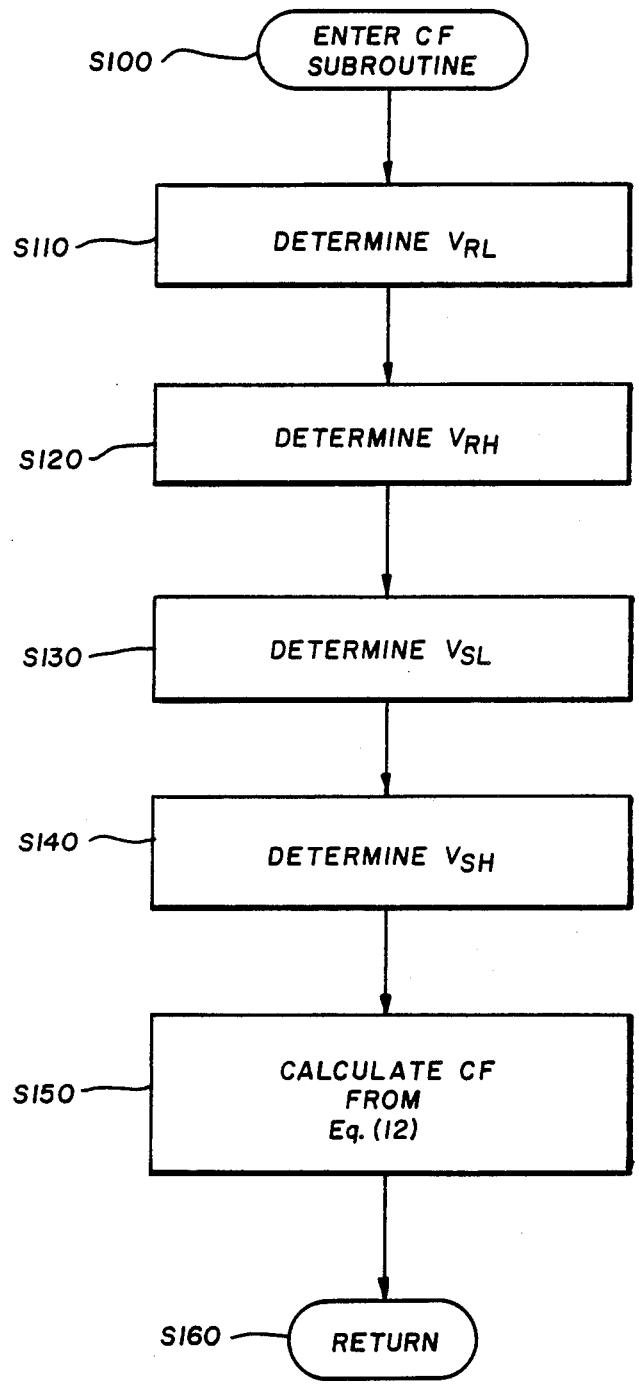

CAPACITIVE GAUGING METHOD AND APPARATUS

This invention relates to a method and apparatus for measuring variable capacitance. It is particularly adapted for use where the variable capacitance is remotely located from signal processing apparatus and where such capacitance constitutes the capacitance of a probe located in a tank or similar vessel, wherein changes in the quantity of liquid (e.g., such as fuel) contained in the tank are reflected by changes in the probe capacitance.

Capacitive-type gauges for measuring fuel in a tank are known. Such systems generally rely on the principle that the probe capacitance varies in accordance with the fuel level. Some examples of such systems already disclosed in U.S. Patents are listed below:
U.S. Pat. No. 4,289,028 Wallman (1981)
U.S. Pat. No. 3,916,689 Donnelly (1975)
U.S. Pat. No. 3,533,286 Westcott et al (1970)
U.S. Pat. No. 4,259,865 Myers (1981)
U.S. Pat. No. 4,086,528 Walton (1978)

Capacitive probes are enclosed in tanks and are remotely monitored (i.e., outside the tank) by electronic gauging circuits. For example, Wallman utilizes the output of a Lo-Z oscillator to selectively pulse a capacitive/diode tank probe, while alternately measuring results of induced changes.

Problems (and sometimes poor performance) are associated with such variable capacitance measuring systems due at least to deleterious effects of stray capacitance on the capacitance being measured, and due to the inescapable voltage drop across diodes in the typical diode pump circuit also employed at the remote tank site. Other common-place problems such as aging of the component elements of such a system may cause "drift" in signal levels, thereby further causing or compounding erroneous fuel quantity indications.

Donnelly addresses at least one of these problems (the problem of stray capacitance) in a variable capacitor/dual diode fuel tank probe gauging system. Donnelly teaches that overall tank probe performance is related to several different factors, including voltage amplitude and excitation frequency of an excitation signal, and capacitance of the tank. A relatively moderate to high voltage level is maintained (e.g., above 10 to as much as 40 volts) as a solution to the problem of diode voltage drop errors. That is to say, Donnelly merely "overpowers" the diode voltage drop with a voltage input level which is more than a level of magnitude higher than the maximum diode drop. A correction signal related to capacitor 16 of a probe 25 is calculated, but this correction signal only establishes a null with respect to an empty-tank condition.

Myers also addresses the problem of diode voltage dropinduced errors, and suggests controlling the oscillator amplitude in a continuous feedback loop so as to maintain a constant voltage-frequency product across the sensing capacitor (i.e., thus being independent of variations in the diode voltage drop). However, as shown in FIG. 2, to achieve temperature compensation, compensating diodes 16 and 17 must be contained within tank 5 along with sensing diodes 7 and 8 so as to share a common temperature environment. Thus, this embodiment of Myers has the drawback of extra connecting wires between the tank to be gauged and the signal processing circuitry, which extra wire might be of critical importance in a given environment, e.g. airplane fuel tanks located in the wings of the plane.

Other tank probe gauging systems are known to exist, but they generally do not offer effective solutions for the capacitive probe problems discussed above. Some examples of such systems include the following U.S. Patents:
U.S. Pat. No. 3,119,267 Bartky (1964)
U.S. Pat. No. 3,747,407 Wallman (1973)
U.S. Pat. No. 4,130,796 Shum (1978)
U.S. Pat. No. 4,337,638 Leonard et al (1982)

The present invention discloses novel method and apparatus for correcting fuel quantity measurements for stray capacitance errors and/or diode voltage drop-induced errors. A correction factor is generated (derived from raw data) to reduce the effects of diode voltage drop errors and stray capacitance errors through use of a switchable amplitude ("high"-"low") Lo-Z oscillator. This method and system enables use of a relatively lower voltage oscillator output (even for the designated "high" amplitude level), which use simplifies the system and reduces its cost in comparison with prior systems such as those which use relatively higher voltages in an attempt to merely mask the diode voltage drop error. The "higher" voltage conventional systems require large step-up transformers and drivers, which are eliminated by the present invention. Furthermore, the potential for highly dangerous spark explosion is sharply lessened with the lower tank energies of the present invention due to the "lower" voltage apparatus. Safety is also enhanced by having sufficiently low voltages that op-amp circuitry may be used which is readily adaptable for current-limited operation.

The correction factor derived by the present invention is also useful in monitoring the relative "health" of the component elements of a tank probe, which elements may be enclosed in the subject tank and therefore difficult if not impossible to monitor directly. Changes in derived correction factors may indicate changes in the performance of the component elements of the embedded probe. Accordingly, changes in the derived correction factor may be monitored to detect and examine the present condition of these component elements, which elements are otherwise difficult to examine. For example, a predetermined acceptable range for the derived correction factor (e.g., 1.01 to 1.1) might be established, and operation of the system suspended or an alarm or flag triggered if the derived factor was found to fall outside of the established range.

In accordance with an exemplary embodiment of the present invention, successive measurements of at least four different digital signals are taken. Subsequent signal processing derives the quantity of liquid in the tank using various of the raw data measurements based on known equations. Additionally, a correction factor is derived from four raw data measurements in accordance with an exemplary embodiment of the present invention, and this correction factor is thereafter applied to raw data based fuel measurements to obtain a corrected fuel quantity indication.

Successive new batches of raw data may be corrected by a single derived correction factor for a period of time, thereby eliminating any need for continuous computation of the error factor. Then, periodically, the correction factor may be newly derived (i.e., updated) in accordance with more current conditions of the tank probe. This repeated calculation of the correction factor (i.e., a type of calibration technique) may be used for monitoring the relative "health" of the tank probe components. As discussed above, certain tank components may be considered suspect if the correction factor is established outside of a certain predetermined range. Alternatively, the correction factor might be simply limited to an established range. Automatic compensation for (i.e., adaptation to) component changes therefore may result from the present invention. The correction factor may be considered as part of a relatively dynamic adaptive feedback system.

The present invention enables use of a relatively low voltage (i.e., less than 10 volts maximum peak output) oscillator, thereby permitting simple and/or more accurate measurements. Previous systems typically rely on large amplitude (i.e., "high" voltage—above 10 volts) oscillators so as to mask or minimize the signal error caused by the diode voltage drop. Improved system accuracy is obtained with the present invention while using a lower amplitude (i.e., low voltage) oscillator, which results in an overall simpler and more economical system. Thus, advancement in both of the (sometimes mutually exclusive) areas of accuracy and simplicity is achieved in accordance with the present invention.

These as well as other features and advantages of this invention may be better understood by reading the following detailed description of the presently preferred exemplary embodiment in conjunction with the accompanying drawings, in which:

FIGS. 3A and 3B are flow charts for operational sequence of the signal processing for the circuitry of FIGS. 2A and 2B.

The method of the present invention calculates a corrected fuel quantity based on a correction factor derived from raw data measurements. It is known that for a linear tank unit model, the average tank unit current $I_{avg}$ is equal to $$I_{avg} = 2V_pFC\left(1 - \frac{V_D}{V_p}\right), \quad (1)$$

where $V_p$ is the Lo-Z amplitude of oscillator voltage across the tank unit, F is the Lo-Z oscillator frequency, C is the tank-unit capacitance, and $V_D$ is the tank unit diode voltage drop.

If raw tank data had no diode voltage drop error, it would be of the form:

$$I_{avg} = 2V_pFC \quad (2)$$

Figure 1:
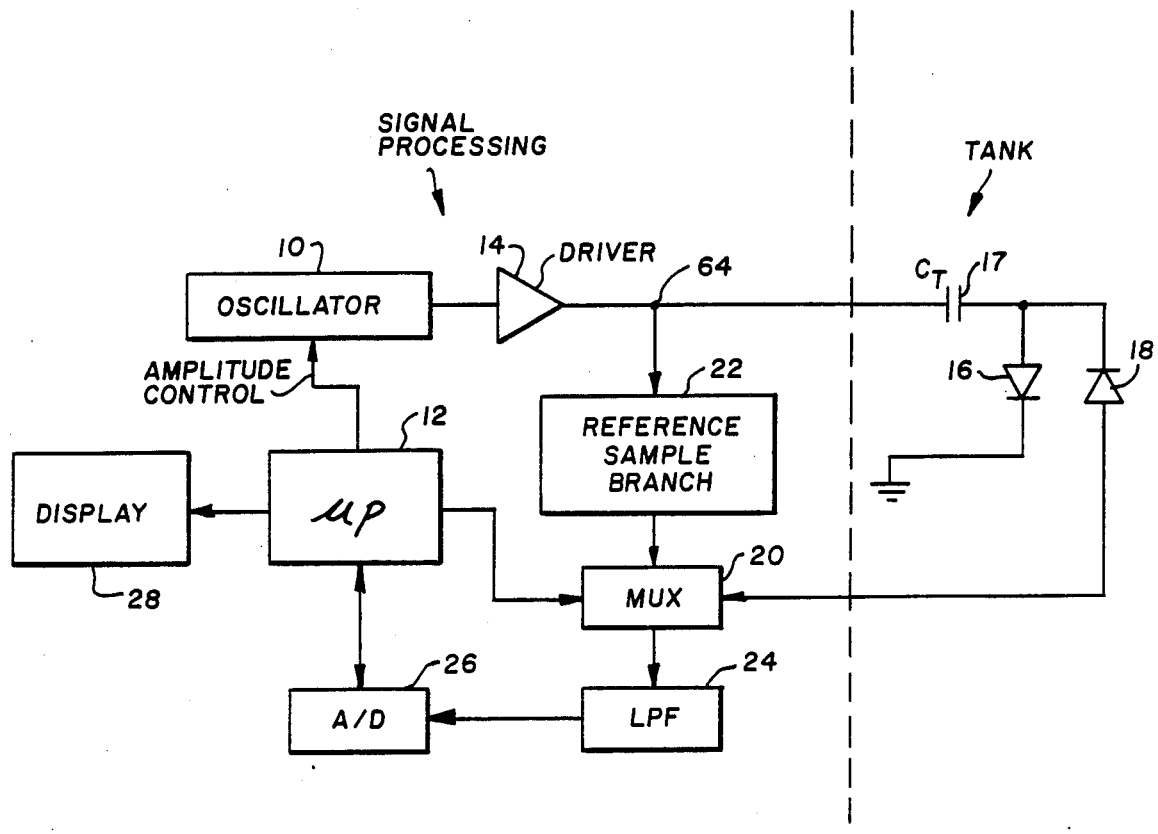
FIG. 1 is a block diagram which functionally represents the method and apparatus of the present invention.

Equation (2) is obtained by calculating the average half-wave rectified current passing through capacitor 17 of FIG. 1 and diode 18 to the gauging electronic circuits.

In order to correct raw data to this form, the present invention determines a correction factor (multiplier CF) of value $$\frac{1}{(1 - V_D/V_p)}$$

using four measured data points. These four data points are obtained by using a selectable-amplitude Lo-Z oscillator in accordance with the present invention.

Capturing reference and sensing signals at each of two Lo-Z selectable amplitudes permits derivation of the correction factor which is derived as now explained. Two Lo-Z oscillator amplitudes provide 4 data points (i.e., a reference sample through branch 22 and a sensing sample through diode 18 for each of the two selectable oscillator amplitudes) to an analog-to-digital converter (A/D) 26 for subsequent signal processing. These data provided to the A/D converter are as follows:

$$V_{RL} = 2V_{PL}FC_RAB \quad (3)$$

$$V_{RH} = 2V_{PH}FC_RAB \quad (4)$$

$$V_{SL} = 2V_{PL}FC_T(1 - V_D/V_{PL})A \quad (5)$$

$$V_{SH} = 2V_{PH}FC_T(1 - V_d/V_{PH})A, \quad (6)$$

where
$V_{RL}$ = Reference Signal for Low Amplitude
$R_{RH}$ = Reference Signal for High Amplitude
$V_{SL}$ = Sensing Signal for Low Amplitude
$V_{SH}$ = Sensing Signal for High Amplitude
A = Hi-Z filter and A/D converter gain
B = Reference circuit gain (elements other than $C_R$)
$V_{PH}$ = Peak Lo-Z voltage of high amplitude
$V_{PL}$ = Peak Lo-Z voltage of low amplitude
$C_R$ = Reference Capacitor
$C_T$ = Tank Capacitance
$V_D$ = Tank Diode Voltage Drop Two ratios are calculated, $V_{RL}/V_{RH}$ and $V_{SL}/V_{SH}$. (Here they are assigned the labels X and Y, respectively, for simplication).

$$X = V_{RL}/V_{RH} = 2V_{PL}FC_RAB/2V_{PH}FC_RAB = V_{PL}/V_{PH} \quad (7)$$

Thus, X becomes simply the ratio of the two Lo-Z voltages.

$$Y = V_{SL}/V_{SH} = 2V_{PL}FC_T(1 - V_D/V_{PL})A/2V_{PH}FC_T(1 - V_D/V_{PH})A \quad (8a)$$

$$Y = V_{PL}(1 - V_D/V_{PL})/V_{PH}(1 - V_D/V_{PH}) \quad (8b)$$

$$Y = (V_{PL} - VD)/(V_{PH} - VD) \quad (8c)$$

Thus, Y is basically the ratio of the two Hi-Z currents. Equation (8c) may be rearranged to isolate $V_D$:

$$V_D = (YV_{PH} - V_{PL})/(Y - 1) \quad (9)$$

This expression for $V_D$ is then substituted into the expression for the correction factor CF:

$$CF = \frac{1}{1 - V_D/V_{PH}} = \frac{1}{1 - \frac{YV_{PH} - V_{PL}}{(Y-1)V_{PH}}} = \frac{1}{1 - \frac{Y - V_{PL}/V_{PH}}{Y - 1}} \quad (10)$$

Substituting X for $V_{PL}/V_{PH}$ (as determined from equation 7, supra) yields:

$$CF = \frac{1}{1 - \frac{Y-X}{Y-1}} \quad (11)$$

This finally rearranges to:

$$CF = \frac{1-Y}{1-X} \quad (12)$$

Raw tank data is multiplied by this correction factor to eliminate both diode voltage drop and stray capacitance errors. (A similar derivation may be used to show that stray capacitance is also corrected by this factor.)

Corrected fuel quantity may then be obtained by calculating:

$$F_{QTY} = \left( \frac{V_{SH} \times CF}{V_{RH}} - \text{Empty} \right) * \text{Scale} \quad (13)$$

Referring to FIG. 1, a dual amplitude Lo-Z oscillator 10 has its amplitude selected between designated high and low relative values by a microprocessor 12, which thereby controls oscillator 10. Driver 14 applies an AC signal from oscillator 10 to the tank capacitance $C_T$ (and to reference sample branch 22), with the diode pair 16 and 18 providing a half-wave rectified DC response sensing signal (i.e., raw data signals) to multiplexer 20. Stray capacitance error in this exemplary embodiment of the present invention may include that occurring between ground and the diode pair 16 and 18, e.g. at the common point of capacitors 17 and diodes 16 and 18.

A reference sample may be taken directly from the output of the oscillator 10 (via driver 14) and passed through reference sample branch 22 (e.g., a reference capacitor Ref C and diode pump, comprised of diodes 16⁻ and 18⁻, monitoring the output of driver 14) to the other input of multiplexer 20.

All signals obtained via multiplexer 20 are preferably conventionally conditioned through low pass filter 24, and then processed through a conventional analog-to-digital converter 26, which provides a conventional digital signal interface with microprocessor 12.

In operation, oscillator 10 is selectively operated under low "L" or high "H" amplitude output conditions (by the microprocessor 12) to cause reference signals (from branch 22) and sensing signals (from diode 18) of "high" or "low" amplitude to be passed through multiplexer unit 20. These digital signals (four in number in this exemplary embodiment) are then received by microprocessor 12, where they are subsequently processed, as discussed above. The respective "high" and "low" amplitudes may be a number of different levels, all under 10 volts. Here, the exemplary "high" amplitude is set to approach 10 volts peak and the "low" is set near 5 volts peak.

Microprocessor 12 provides a portion of the signal processing to provide both signal output and correction functions. The correction factor CF is periodically derived in the microprocessor 12 based on four raw data points ($V_{RL}$, $V_{RH}$, $V_{SL}$, $V_{SH}$) received through analog-to-digital converter 26. The usual stream of raw data using the high or low amplitude Lo-Z oscillator mode (also received by microprocessor 12 through analog-to-digital converter 26) is then corrected by the derived correction factor, and a corrected fuel quantity measurement is displayed on display device 28 (e.g., a conventional LED or LCD device).

A conventional feature may be further combined with the present invention under the control of the microprocessor 12. While holding the ocillator amplitude steady, the oscillator frequence may be varied (e.g., by varying the clock E control signal to counter/divider 4020) and resulting signals through the diode pumps (16/18 and 16⁻/18⁻, respectively) compared to determine the resistive component of the capacitive tank probe, with subsequent compensation therefor.

Figure 2A:
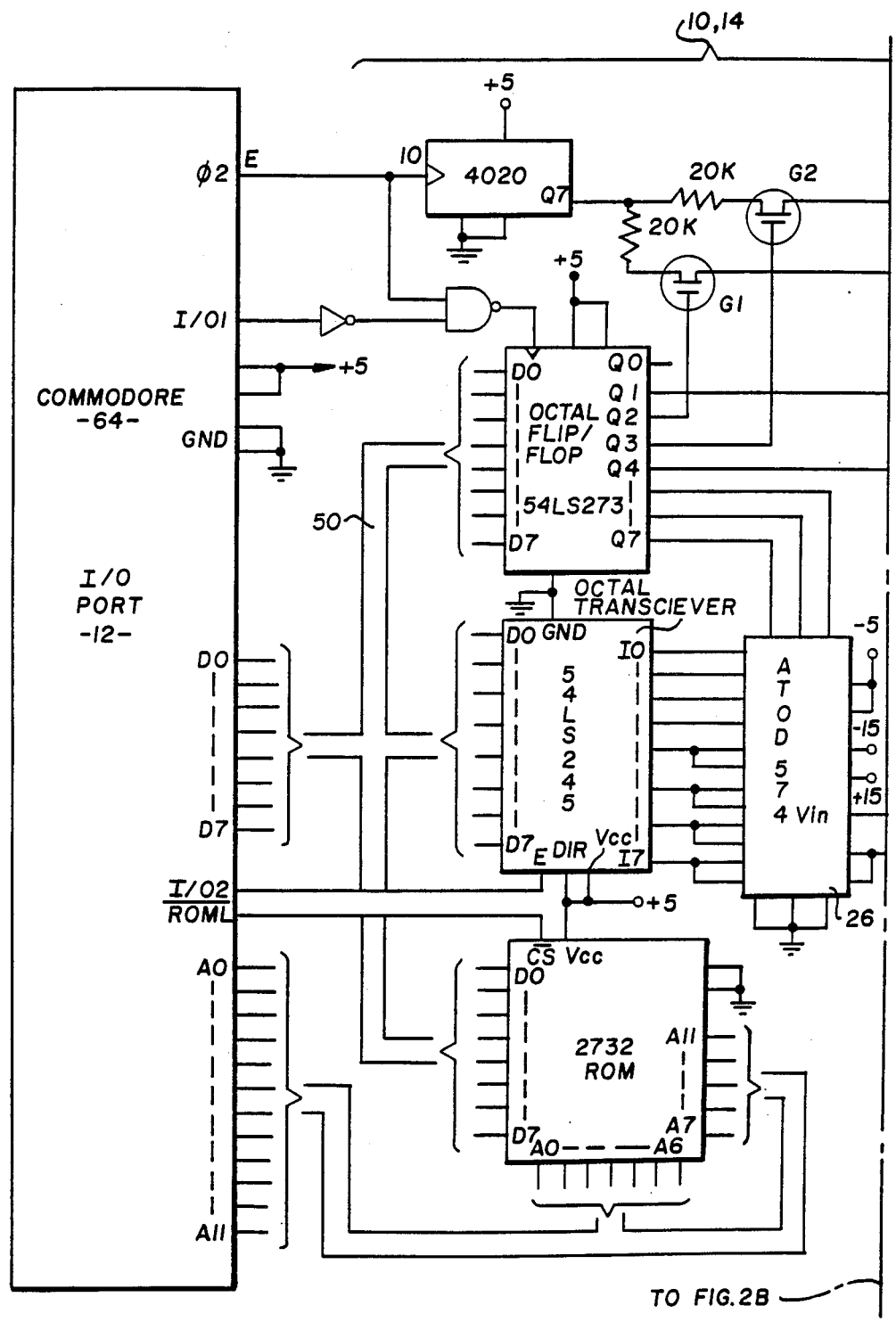
FIGS. 2A and 2B are specific exemplary circuitry which may be used in accordance with the present invention.
Figure 2B:
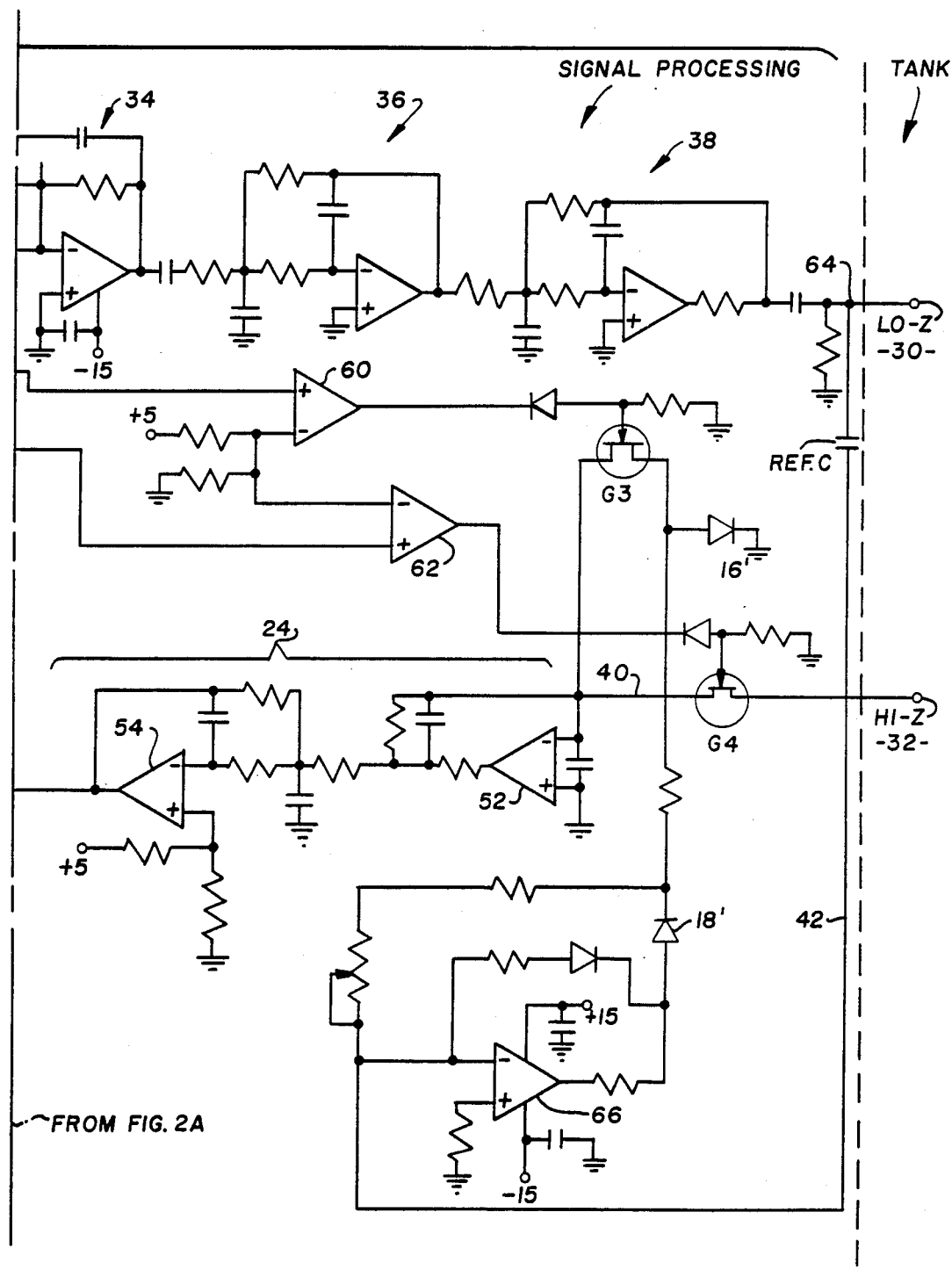

FIGS. 2A and 2B represent a more specific exemplary embodiment of hardware apparatus which may be operated to obtain a corrected fuel quantity measurement. All indicated chip numbers are conventional commercially available devices which are interconnected as depicted in the drawings.

The microprocessor 12 may be any suitable microprocessor, such as a Commodore 64 microcomputer unit. If selected, a Commodore 64 would be connected at its input/output port as shown in FIG. 2A.

FIG. 2A is a continuation of FIG. 2B and should be placed with its right hand side in alignment with the proper portions of the left-hand side of FIG. 2B for complete viewing of a presently preferred exemplary embodiment of the invention.

The counter/divider 4020 element of FIG. 2A functions in series with cascaded op amp stages 34, 36 and 38 as the oscillator 10 and driver 14 of FIG. 1. The output Q7 of counter/divider 4020 is fed to the inverting input of op amp 34 through either one or both of two parallel 20KΩ resistors, which are respectively connected thereto by controlled gates G1 and G2. Gates G1 and G2 are respectively controlled by outputs Q2 and Q3 of the Octal Flip/Flop 54LS273, which is in turn under control of microprocessor 12.

With selective control of the gates G1 and G2, the input to op amp 34 can have 20KΩ input impedance (i.e., either one of these gates conducting), 10KΩ input impedance (i.e., both gates conducting to make a parallel connection of the two 20KΩ resistors) or infinite input impedance (i.e., neither of the gates conducting thereby creating an open circuit input). Op amp 34 is designed in a known manner such that a switchable input impedance will cause output switching between designated low amplitude "L" and high amplitude "H" levels. In this way, the microprocessor 12 controls the amplitude output level of oscillator 10, as shown in FIG. 1.

To process incoming signals, microprocessor 12 also selects between "reference" inputs and "sensing" inputs. This function is achieved through selective operation of gates G3 and G4, under the control of outputs Q1 and Q4, respectively, of the Octal Flip/Flop. The G3 control voltage is buffered through op amp 60, and G4 control voltage is buffered through op amp 62. These buffers collectively may be formed by a single conventional HA-4741 general purpose quad op amp integrated circuit chip. Together with gates G3 and G4 they function as the multiplexer 20 of FIG. 1 to select the appropriate (reference or sensing signal) input for buffer and low pass filter op amps 52 and 54. The selected inputs are passed by op amps 52 and 54 to the analog-to-digital converter AD574 of FIG. 2A (element 26 of FIG. 1). The A/D converter converts the analog signals to digitized signals for further processing in microprocessor 12.

Selection of the reference signals ($V_{RL}$ and $V_{RH}$ for low and high, respectively) is achieved under microprocessor control by functionally causing gate G3 to be conductive while causing gate G4 to not be conductive. When these gate selections are made, reference signals are picked off at point 64 (see also FIG. 1) of the oscillator output and routed through the reference C, line 42 and op amp 66 (with its associated diode pump circuit comprised of diodes 16− and 18−), which collectively constitute the reference sample branch 22 of FIG. 1. The reference sample signals are then passed by gate G3 to op amp 52, and reference signals $V_{RL}$ and $V_{RH}$ are thereby obtained.

Selection of the sensing signals ($V_{SL}$ and $V_{SH}$ for low and high, respectively) requires selective operation of the oscillator (at its two respective amplitudes) and sensing of signals returned by the probe through Hi-Z connector 32 of FIG. 2B (i.e., the return path through diode 18 of FIG. 1). Gate G3 is made non-conductive while gate G4 is made conductive so as to cause analog DC signals present at connector 32 to be passed along line 40, through G4 and to op amp 52 for additional signal processing.

The bus line 50 of the microprocessor 12 is connected in conventional fashion with ROM 2732 and the octal bus transceiver device 54LS245.

In the foregoing manner, four raw data signals are obtained. Further signal processing of these raw data according to the present exemplary embodiment will be discussed below with respect to a functional flow chart description of a suitable program segment for controlling operation of microprocessor 12.

Figure 3A:
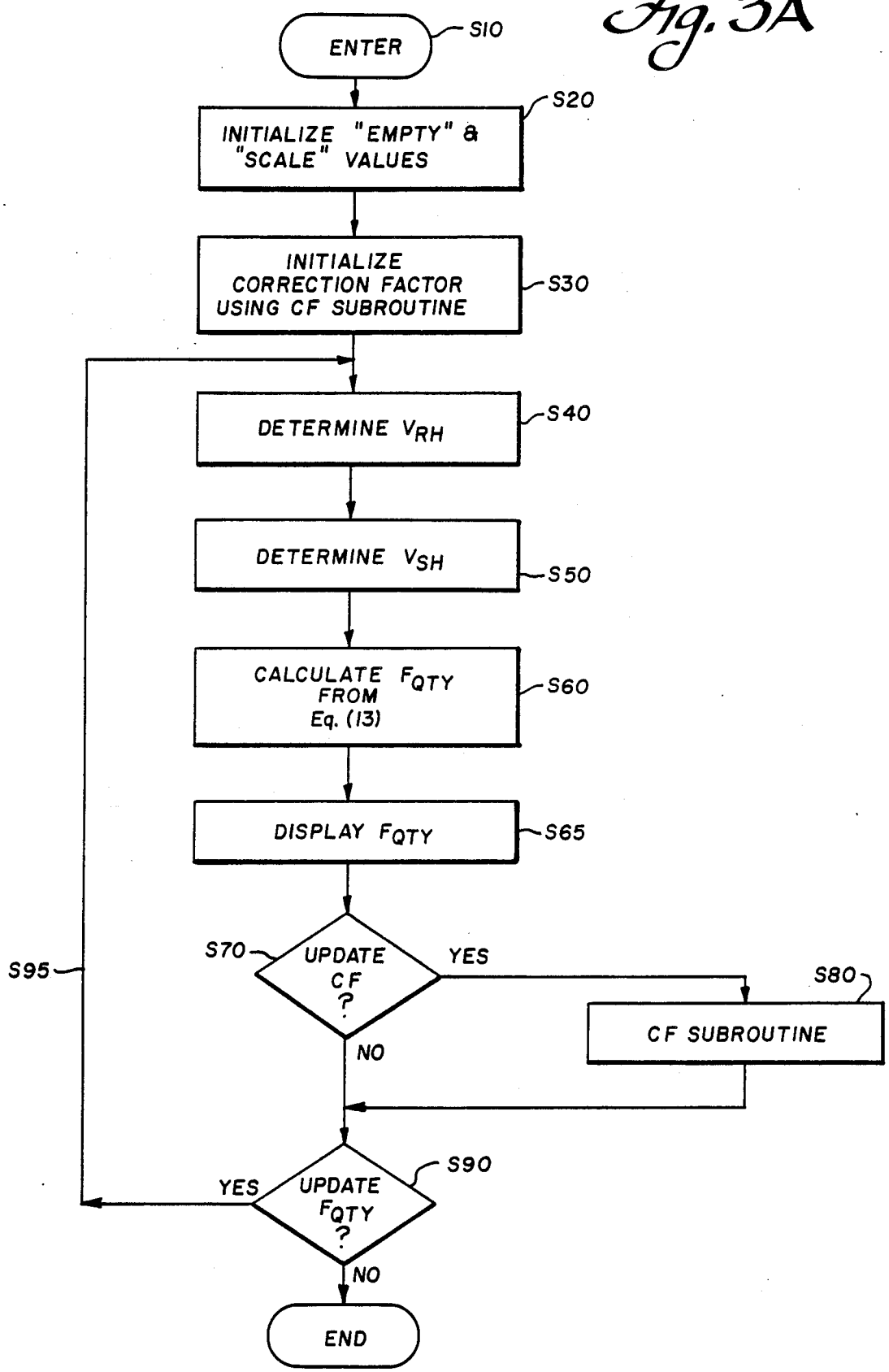

FIG. 3A refers to a main operational or functional sequence, while FIG. 3B refers to a subroutine or secondary operational sequence wherein the correction factor CF is calculated based on newly determined raw data values.

Step S10 enters the main functional sequence (e.g., upon turn on) and step 20 initializes the values of "Empty" and "Scale" for later use in equation (13), defined supra. The first pass through the functional sequence of FIG. 3A causes an automatic jump (step S30) to the CF Subroutine so as to initialize the CF (i.e., correction factor) value. Steps S40 and S50 involve determinations of $V_{RH}$ and $V_{SH}$, respectively. As discussed above, the microprocessor 12 appropriately and selectively controls (indirectly) gates G1-G4 to cause high/low amplitude output of the oscillator and reference/sensing signal input to the A/D converter.

Thus, in steps S40 and S50 gates G1 and G2 are controlled so that the oscillator output amplitude is in its defined high (i.e., "H") state. For step S40, gate G3 is held conductive and gate G4 is held non-conductive so that the reference signal will be input to op amp 52 as discussed, supra. In step S50, the conductive states of gates G3 and G4 are respectively reversed so that a sensing signal is applied to op amp 52.

Once step S50 is completed, all of the necessary terms of equation (13) have been obtained, and calculation of $F_{QTY}$ in step S60 proceeds, with the calculated amount subsequently shown on display 28 (step S65). Branch S70 is a decision point (e.g., based on elapsed time) to determine whether it is desirable to update the correction factor (i.e., re-calculate CF based on more current raw data values) or continue to use the most recently calculated correction factor. A "Yes" decision in step S70 branches to CF subroutine step S80 (discussed further below with regard to FIG. 3B), while a "No" decision causes a jump to the next decision point in step S90. In this second decisional branch point (e.g., also based on elapsed time), selection is made whether to update the calculation for $F_{QTY}$, which update might be based on a new or previously existing CF, dependent upon the decision in step S70.

If step S70 branch "No" was taken and step S90 branch "Yes" was taken, then fuel quantity is updated based on the previously calculated CF, but with new raw data for $V_{RH}$ and $V_{SH}$. If both decision points were to yield "Yes" results, then new fuel quantity calculations would be made based on an updated correction factor. Return loop S95 is continuously repeated until the "No" branch is taken in step S90 thereby ending operation of the main routine. As will be appreciated, if the microprocessor is dedicated to this task, then decision S90 may be dispensed with in favor of an unconditional branch along S95. Otherwise a branch from END may go to other processes and then a branch back to S95 may be taken from within such other processes.

With regard to the operation of the correction factor (CF) subroutine of FIG. 3B, the four previously-discussed raw data values are obtained in steps S110 through S140. Again, the microprocessor 12 selectively controls gates G1-G4 to obtain the four raw data values, as discussed above. In step S150, the CF is calculated as defined by equation (12) using the then obtained four raw data values. Once CF is calculated in step S150, a return is made through S160 to the appropriate point of the main functional sequence (either step S30 or S80).

The specific embodiment presently disclosed is intended to be exemplary only, and it is to be understood that there are many modifications and variations which may be made while yet retaining many of the novel advantages and features of this invention.

For example, alternative embodiments of the dual amplitude oscillator may be permitted in accordance with the present invention, as well as the selection of any other adequate signal processor means. Or, as further non-limiting example, the completion branch of step S80 might return directly to step S40 so that $F_{QTY}$ is always updated whenever a new CF is calculated. All such modifications and variations are intended to be included within the scope of the appended claims.

What is claimed is:

1. A capacitive gauging system comprising:
   a single capacitance/diode tank-level probe;
   a reference circuit;
   controlled oscillator means for selectively and successively providing output signals of the low voltage having either of at least two predetermined characteristics in response to applied control signals, said output signals adapted to be applied to said capacitance/diode tank-level probe to be gauged and to said reference circuit;
   control means connected to said oscillator means, to said reference circuit, and to said probe for controlling their operation so as to make available a sequence of at least four response signals comprising (a) a first reference signal from the reference circuit, (b) a second reference signal from the reference circut, (c) a first sensing signal from the probe, and (d) a second sensing signal from the probe, the first and second response signals of low and high amplitudes, respectively, but both less than approximately 10 volts;

detecting means for detecting said four response signals; and signal processing means for gauging said tank-level probe capacitance by performing signal correction processes utilizing said four detected response signals and including means for determining a correction factor for use in said gauging to eliminate detecting errors due at least to a voltage drop across a diode of said probe, said correction factor being determined from said detected signals.

2. A system as in claim 1 wherein said gauging of said tank-level probe constitutes determining a quantity of liquid contained within said tank, with said capacitance of said probe being variable as a function of said quantity of liquid.

3. A system as in claim 2 wherein said signal processing means includes means for determining liquid quantity in accordance with:

$$F_{QTY} = \left( \frac{V_{SH} \times CF}{V_{RH}} - \text{Empty} \right) * \text{Scale},$$

where $F_{QTY}$ represents determined fuel quantity, CF represents said correction factor, $V_{SH}$ represents a detected high amplitude sensing signal and $V_{RH}$ represents a detected high amplitude reference signal.

4. A system as in claim 3, wherein CF is defined by:

$$CF = \frac{1 - Y}{1 - X},$$

where X is the ratio of $V_{RL}$ (said detected low amplitude reference signal) to $V_{RH}$, and Y is the ratio of $V_{SL}$ (said detected low amplitude sensing signal) to $V_{SH}$.

5. A system as in claim 1 wherein said signal processing means further includes means for determining whether said correction factor is within a predetermined range, thereby monitoring the relative "health" of the probe components.

6. A system as in claim 1 wherein said oscillator means comprises a relatively low voltage output oscillator having at least two controllable amplitudes of output signals.

7. A system as in claim 6, wherein said controllable amplitude output signals are 10 volts peak and 5 volts peak, respectively, and dsignated as "high" and "low" output signals.

8. A capacitive liquid-measuring system for use with a single capacitance probe enclosed in a tank, said system comprising:

a single pair of diodes, enclosed in said tank and connected to said probe capacitance, adapted to perform half-wave rectification of AC signals presented to said capacitance probe and passed back as response signals; and signal processing means, connected to at least one of said diodes, for measuring said capacitance of said probe which varies as a function of said quantity of liquid, said signal processing means comprising:

switchable high/low amplitude oscillator means for selectively presenting to said probe capacitance a sequence of low and high amplitude signals both of which are less than approximately 10 volts which subsequently appear as response signals via said at least one diode as respective low and high amplitude sensing signals, and for also selectively generating low and high amplitude reference signals, and digital signal processing means for detecting said low and high amplitude sensing signals and said low and high amplitude reference signals, and for calculating said quantity of liquid using a correction factor derived from said detected reference and sensing signals so as to correct for measurement errors introduced by inherent diode voltage drop and/or by stray capacitance acting on said capacitance probe.

9. A system as in claim 8 wherein only two wires are necessary to connect said diodes in said tank with said signal processing means.

10. A system as in claim 8 further comprising control means, connected to and controlled by said digital signal processing means, for controlling the selective operation of said oscillator means.

11. A system as in claim 8 wherein variations in said derived correction factor are also monitored as being indicative of the respective physical conditions of said diodes, said capacitance probe and interconnections therewith.

12. A system as in claim 8 wherein said oscillator means comprises a relatively low voltage oscillator.

13. A system as in claim 12 wherein said relatively low voltage is defined as a maximum of 10 volts peak with said switchable amplitudes being designated mutually distinct peak voltage levels less than said maximum 10 volts peak.

14. A method of measuring liquid quantity in a tank comprising the steps of:

providing a single capacitance probe within said tank, the capacitance of which varies as a function of the quantity of liquid in said tank, and providing coupling diodes to connect said capacitance probe with signal processing circuitry;

sucessively injecting said probe with at least low and high amplitude voltage signals both of which are less than approximately 10 volts which are subsequently obtained from said coupling diodes as a sensing signal portion of said raw data ($V_{SL}$ and $R_{SH}$, respectively), and generating low and high amplitude voltage reference signals which are subsequently obtained as a reference signal portion of said raw data ($V_{RL}$ and $V_{RH}$, respectively);

obtaining raw data from said injected signals;

deriving a correction factor from said raw data to correct for stray capacitance and/or for the average voltage drop across said coupling diodes; and deriving with said signal processing circuitry a corrected fuel quantity measurement using said derived correction factor and at least a portion of said raw data, said deriving steps each responsive to said raw data including both sensing and reference signal portions.

15. A method as in claim 14 wherein said first-mentioned deriving step includes deriving said correction factors by calculating:

$$CF = \frac{1 - Y}{1 - X},$$

where X represents the ratio of $V_{RL}$ (low amplitude reference signal) to $V_{RH}$ (high amplitude reference signal), and Y represents the ratio of $V_{SL}$ (low amplitude sensing signal) to $V_{SH}$ (high amplitude sensing signal).

16. A method as in claim 15, wherein said second-mentioned deriving step includes deriving said liquid quantity measurement by performing the calculation:

$$F_{QTY} = \left( \frac{V_{SH} \times CF}{V_{RH}} - \text{Empty} \right) * \text{Scale},$$

where Empty represents an offset value to yield a zero result for $F_{QTY}$ when the tank holds no liquid and Scale represents a predetermined multiplier to permit meaningful display of the calculated fuel quantity.

* * * * *